US012791600B2

(12) United States Patent
Anglhuber

(10) Patent No.: US 12,791,600 B2
(45) Date of Patent: Nov. 10, 2026

(54) METHOD AND DEVICE FOR PERSONAL PROTECTION DURING HIGH-VOLTAGE TESTING

(71) Applicant: OMICRON electronics GmbH, Klaus (AT)

(72) Inventor: Martin Anglhuber, Feldkirch (AT)

(73) Assignee: OMICRON electronics GmbH, Klaus (AT)

( * ) Notice: Subject to any disclaimer, the term of this patent is extended or adjusted under 35 U.S.C. 154(b) by 693 days.

(21) Appl. No.: 17/792,896

(22) PCT Filed: Jan. 12, 2021

(86) PCT No.: PCT/EP2021/050485
§ 371 (c)(1),
(2) Date: Jul. 14, 2023

(87) PCT Pub. No.: WO2021/144266
PCT Pub. Date: Jul. 22, 2021

(65) Prior Publication Data
US 2023/0067832 A1 Mar. 2, 2023

(30) Foreign Application Priority Data
Jan. 15, 2020 (AT) .............................. A 50024/2020

(51) Int. Cl.
*G01R 31/14* (2006.01)
*G01R 19/165* (2006.01)
(Continued)

(52) U.S. Cl.
CPC ......... *G01R 31/14* (2013.01); *G01R 19/1659* (2013.01); *G01R 31/62* (2020.01); *H02H 5/12* (2013.01)

(58) Field of Classification Search
CPC .... G01R 31/14; G01R 19/1659; G01R 31/62; G01R 31/3183; G01R 27/18; G01R 31/56; G01R 19/30; G01R 27/02; H02H 5/12
See application file for complete search history.

(56) References Cited

U.S. PATENT DOCUMENTS 3,211,998 A 10/1965 Kidwell
4,799,130 A 1/1989 Emerson
(Continued)

FOREIGN PATENT DOCUMENTS

CN 1419130 A 5/2003
CN 201449437 U 5/2010
(Continued)

OTHER PUBLICATIONS

International Search Report from corresponding International Patent Application No. PCT/EP21/50485, dated Apr. 21, 2021.
(Continued)

*Primary Examiner* — Giovanni Astacio-Oquendo
*Assistant Examiner* — Haidong Zhang
(74) *Attorney, Agent, or Firm* — Renner, Otto, Boisselle & Sklar, LLP

(57) ABSTRACT

The invention relates to a method for personal protection during high-voltage testing on a test object, the method comprising the steps of outputting a high-voltage alternating current for the test object by means of a high-voltage generation device, which has a high-voltage transformer for generating the high-voltage alternating current. The method further has the steps of determining a curve over time of at least one electrical variable at the high-voltage transformer during the output of the high-voltage alternating current, and
(Continued)

ending the output of the high-voltage alternating current on the basis of the curve over time of the at least one electrical variable.

23 Claims, 3 Drawing Sheets

(51) Int. Cl.

| | |
|---|---|
| ***G01R 31/62*** | (2020.01) |
| *H02H 5/12* | (2006.01) |

(56) References Cited

U.S. PATENT DOCUMENTS

| | | | | | |
|---|---|---|---|---|---|
| 5,574,378 | A * | 11/1996 | Meyer | G01R 31/52 | 361/57 |
| 7,305,310 | B2 * | 12/2007 | Slota | G01R 35/04 | 702/57 |
| 2002/0105336 | A1 | 8/2002 | Swale | | |
| 2003/0020484 | A1 * | 1/2003 | Clinton | H04B 3/46 | 324/544 |
| 2004/0036464 | A1 * | 2/2004 | Brewer | G01R 21/133 | 324/142 |
| 2005/0231188 | A1 * | 10/2005 | Wang | G01R 31/12 | 324/117 R |
| 2011/0031980 | A1 * | 2/2011 | Kruger | G01R 31/62 | 324/547 |
| 2011/0128013 | A1 * | 6/2011 | Werle | G01R 31/58 | 324/543 |

FOREIGN PATENT DOCUMENTS

| | | | |
|---|---|---|---|
| CN | 108387829 | A | 8/2018 |
| CN | 110611293 | A | 12/2019 |
| DE | 2733784 | A1 | 2/1979 |
| EP | 1223730 | A2 | 7/2002 |
| KR | 20170103944 | A | 9/2017 |

OTHER PUBLICATIONS

Search Report (with English translation) dated Feb. 17, 2025 from related/corresponding Chinese Patent Application No. 202180009524.5.

Notice of Allowance (with English translation) dated Nov. 28, 2025 from related/corresponding Korea Patent Application No. 10-2022-7027096.

* cited by examiner

METHOD AND DEVICE FOR PERSONAL PROTECTION DURING HIGH-VOLTAGE TESTING

FIELD OF THE INVENTION

The present invention relates to a method for personal protection during a high-voltage test on a test object and to a high-voltage generating device that operates in accordance with the method for personal protection.

BACKGROUND OF THE INVENTION

High-voltage insulation measurements, for example capacitance measurements and loss factor measurements, are established methods to test the state of high-voltage apparatuses, such as for example transformer insulations or bushing insulations. High test voltages, in particular high AC voltages, of a few 1000 V, for example 10 kV, are used in this case. A measurement current can be a few 100 mA, for example up to 300 mA.

Appropriate measuring apparatuses are usually constructed in such a way that a user is protected from the high test voltage, for example through suitable insulation of the measuring apparatus and the measuring lines used. Parts that are not insulated or badly insulated and to which the high voltage is applied during the test can however be present on the test specimen itself, for example on a transformer or some other high-voltage device. In order to protect a person from an electrical hazard during the measurement, the test area can be made inaccessible, for example, and warning signals can be output, for example visual warning signals with a red light or a flashlight, and acoustic warning signals, for example a loud warning tone. The personal protection is therefore based on the assumption that all the people involved in the test and all the people in the test area know and adhere to appropriate safety regulations. In spite of these safety regulations, accidents are a frequent occurrence, for example if safety regulations are not adhered to or are bypassed. As a result of the high voltage used during the test, there is a considerable risk to the life of a person if the person comes into contact with live parts.

SUMMARY OF THE INVENTION

In the prior art there is therefore a need to improve personal protection during high-voltage tests or high-voltage measurements.

According to the present invention, what is provided is a method for personal protection during a high-voltage test on a test object and a high-voltage generating device for a high-voltage test on a test object as claimed in the independent claims. The dependent claims define preferred or advantageous embodiments of the invention.

A method for personal protection during a high-voltage test on a test object comprises outputting a high-voltage AC current for the test object by means of a high-voltage generating device. The high-voltage generating device has a high-voltage transformer for generating the high-voltage AC current. By way of example, the high-voltage AC current can be used to carry out a high-voltage insulation measurement on the test object. The high-voltage AC current can have a voltage in the range of, for example, from 2 kV to 12 kV. Furthermore, in the method a temporal profile of at least one electrical variable on the high-voltage transformer is determined while the high-voltage AC current is being output. By way of example, the temporal profile of the at least one electrical variable can be measured directly on the high-voltage transformer or can be determined from one or more measurements on the high-voltage transformer by means of a control device or processing device. The output of the high-voltage AC current is ended depending on the temporal profile of the at least one electrical variable.

A temporal profile of one or more electrical variables, for example current, voltage, power, phase angle or impedance, on a test object, such as a high-voltage transformer or a high-voltage bushing, for example, differs from a corresponding temporal profile of the one or more electrical variables of a human body through which current flows, with the result that it is possible to identify whether a person is in contact with the high-voltage AC current from an observation of this temporal profile. If such contact of a person with the high-voltage AC current is identified in this way, the high-voltage AC current can be disconnected to protect the person from injury. In this case it is of great importance that the disconnection is effected as quickly as possible, since the length of the exposure time of the high-voltage AC current on the person can have a significant influence on the extent of a possible injury. By way of example, with a current flow of 200 mA and an exposure time of less than 300 ms, muscle contractions with reversible effects generally occur, whereas with a longer exposure time or a higher current flow, irreversible effects are possible and additionally the likelihood of ventricular fibrillation increases considerably.

By way of example, the high-voltage transformer can have an input side with an input winding and an output side with an output winding. The high-voltage AC current is output for the test object at the output winding. The temporal profile of the at least one electrical variable is determined by means of detection on the input side of the high-voltage transformer. The output of the high-voltage AC current is ended depending on the temporal profile of the at least one electrical variable ascertained in this way. There are usually considerably lower voltages present on the input winding of the high-voltage transformer than on the output winding of the high-voltage transformer. On account of the lower voltage, a measurement of, for example, the current and the voltage on the input side can be carried out more cost-effectively and in particular more quickly than on the output side. The electrical variables on the input winding and the output winding of the high-voltage transformer are directly dependent on one another, however, with the result that the electrical variables on the output winding can be deduced from the electrical variables on the input winding. As a result, it is possible to quickly identify whether a person is in contact with the high-voltage AC current, meaning that it is possible to achieve a quick disconnection. The relationship between the electrical variables on the input winding and the electrical variables on the output winding is determined by way of properties of the high-voltage transformer. Therefore, the high-voltage AC current can also be disconnected depending on at least one property of the high-voltage transformer. In other words, in the decision as to whether the high-voltage AC current is continued to be output or is disconnected, an electrical variable on the input winding can be detected and, by means of the properties of the high-voltage transformer, corresponding electrical variables on the output winding can be deduced.

According to one embodiment, the at least one electrical variable comprises a phase position and an absolute value of a current on the high-voltage transformer and a phase position and an absolute value of a voltage on the high-voltage transformer. In the method, a phase angle between the current and the voltage on the high-voltage transformer can also be determined based on the phase positions of the current and the voltage. The output of the high-voltage AC current is ended if the phase angle is smaller than a predefined phase angle threshold value. The phase angle threshold value can be in the range of, for example, from 80° to 89°, preferably for example can be 80° or 85°. By way of example, the high-voltage AC current can be switched off if the phase angle is smaller than 80°. In the case of an insulation measurement and essentially intact insulation of the test specimen or test object, the test specimen essentially constitutes a capacitive load, with the result that the phase angle between the current and the voltage is virtually 90°. In this case, the current lags the voltage virtually by 90°. If a person is in contact with the high-voltage AC current, the phase angle decreases since the person constitutes a resistive load. If a corresponding change of the phase angle between the current and the voltage is established, the high-voltage AC current can be disconnected to protect the person.

Alternatively or additionally, a loss factor can be determined based on the phase positions of the current and the voltage. The output of the high-voltage AC current is ended if the loss factor is greater than a predefined loss factor threshold value. The loss factor threshold value can have a value in the range of, for example, from 0.5% to 10%, preferably 5% or 10%. The loss factor is equal to the tangent of the loss angle, which, in the case of a capacitance, corresponds to 90° minus the phase angle.

In a further embodiment, an impedance of a load connected to the high-voltage transformer is determined based on the absolute values and the phase positions of the current and the voltage. The output of the high-voltage AC current is ended if the impedance is lower than a predefined impedance threshold value. The impedance threshold value can be in the range of, for example, from 30 kΩ to 70 kΩ and is preferably 50 kΩ. In high-voltage devices in which the insulation is essentially in working order, the impedance is generally considerably more than 50 kΩ, usually more than 70 kΩ Lower impedances therefore indicate either a defect in the insulation of the high-voltage device, or that a person is in contact with the high-voltage AC current. A disconnection in this case can therefore effectively protect the person from an electric shock and the consequences thereof.

In a further embodiment of the method, a temporal profile of a power output by the high-voltage transformer is determined. The power output by the high-voltage transformer is determined based on temporal profiles of the absolute values and the phase positions of the current and the voltage. By way of example, an rms value of the power output by the high-voltage transformer can be determined. The output of the high-voltage AC current is ended if the output power changes by more than a predefined power change value within a predefined time period. By way of example, the power change value can be a relative value, for example in the range of from 10% to 30%, preferably for example 20%. The predefined time period can be in the range of a few milliseconds, for example 10 ms to 300 ms, preferably 200 ms. In other words, the high-voltage AC current is disconnected if, for example, it is determined that the power output by the high-voltage transformer increases by more than, for example, 20% within, for example, 200 ms. Assuming that the voltage output by the high-voltage transformer has not been increased in this predefined time period, this increase in the output power can indicate that a person has touched a live part, with the result that an additional current is flowing through this person and the output power is increased as a result. By virtue of this power increase being detected in a relatively short time period of, for example, 200 ms, the high-voltage AC current can be rapidly disconnected, with the result that the person is only exposed to the high-voltage AC current for a very short time period.

In a further example, the output of the high-voltage AC current is ended if the absolute value of the current exceeds a predefined current threshold value. The current threshold value can be in the range of from 100 mA to 300 mA and is preferably 200 mA. By way of example, the current can be the rms value of the current. As has already been described above, exposure to a current of 200 mA for a time period of 300 ms generally does not cause any irreversible damage and also the likelihood of ventricular fibrillation is relatively low.

The output of the high-voltage AC current can also be ended if a temporal profile of the absolute value of the current changes by more than a predefined current change value within a predefined time period. The predefined time period can again be in the range of from 10 ms to 300 ms and can preferably be 200 ms. The current change value can be a relative value and for example can be 10% to 20%. In this example, the high-voltage AC current is therefore disconnected if the current increases by more than 20% within, for example, 200 ms. By way of example, the current can be the rms value of the current. If a person touches a live part, such a sudden increase in the current can occur. A disconnection of the high-voltage AC current in this case can therefore reduce the danger to the person.

In a further embodiment, the output of the high-voltage AC current is ended if the absolute value of the voltage does not reach a predefined minimum voltage during output of the high-voltage AC current for the test object. The minimum voltage can be in the range of, for example, from 1 kV to 10 kV. The reason that the predefined minimum voltage is not reached can be, on the one hand, that the test object does not have sufficient insulation, but also, on the other hand, that a person is in contact with a live part and current is flowing through the person as a result and, on account of the limited performance of the high-voltage transformer, this current limits the maximum output voltage. A disconnection under these conditions can therefore contribute to protecting the person.

The output of the high-voltage AC current can also be ended if a temporal profile of the absolute value of the voltage changes by more than a predefined voltage change value within a predefined time period. By way of example, the voltage change value can be an absolute value or a percentage value of a value of the voltage at the start of the predefined time period. By way of example, the voltage change value can be in the range of from −10% to −20%, that is to say that the high-voltage AC current is disconnected if the voltage changes by for example 10% or for example 20% within the predefined time period. If a person touches a live part during the high-voltage test, the current to be output by the high-voltage transformer can be increased considerably through the additional current flow through the person, with the result that, on account of the limited performance of the high-voltage transformer, the voltage dips. Owing to this situation, a disconnection of the high-voltage AC current can therefore reduce the danger to the person.

In a further embodiment, the high-voltage AC current is output with a voltage absolute value that is increased continuously or in stages. By way of example, the high-voltage AC current, starting at a low voltage, for example in the order of magnitude of 25 V or 100 V, can be increased continuously or in stages up to a final voltage. The high-voltage AC current can be increased from the low voltage, which can for example also be 1 kV, up to the final voltage of for example 12 kV for example in stages of e.g. 1 kV to 12 kV in a period of time of a few seconds, for example in the range of from 1 second to 5 seconds, preferably within 3 seconds. In connection with the above-described protective mechanisms that identify that a person is touching a live part and then disconnect the high-voltage AC current, the danger to the person can be further reduced, since a disconnection can already be carried out before the full measurement voltage of for example 12 kV is reached.

A high-voltage generating device for a high-voltage test on a test object comprises a high-voltage transformer, an output and a control device. The high-voltage transformer serves for generating a high-voltage AC current. The high-voltage AC current is provided for the test object at the output. The control device is designed to protect a person during the high-voltage test by virtue of the control device outputting the high-voltage AC current for the test object via the output and determining a temporal profile of at least one electrical variable on the high-voltage transformer while the high-voltage AC current is being output. The control device ends the output of the high-voltage AC current depending on this temporal profile of the at least one electrical variable. The high-voltage generating device is therefore suitable for carrying out the above-described methods and therefore also comprises the advantages described in connection with the above-described methods.

The high-voltage generating device or the corresponding test system can preferably be in the form of a portable device or unit.

BRIEF DESCRIPTION OF THE DRAWINGS

The present invention will be described in detail below with reference to the accompanying figures.

DETAILED DESCRIPTION OF THE INVENTION

The above-described properties, features and advantages of this invention and the manner in which they are achieved become clearer and more distinctly comprehensible in connection with the following description of exemplary embodiments, which are explained in more detail in connection with the drawings.

The present invention is explained in more detail below using embodiments with reference to the drawings. In the figures, identical reference signs denote identical or similar elements. The figures are schematic representations of different embodiments of the invention. Elements illustrated in the figures are not necessarily illustrated true to scale. The different elements illustrated in the figures are reproduced in such a way that their function and general purpose becomes comprehensible to a person skilled in the art. Connections and couplings illustrated in the figures between functional units and elements can also be implemented as indirect connection or coupling. Functional units can be implemented as hardware, software, or a combination of hardware and software.

Figure 1:
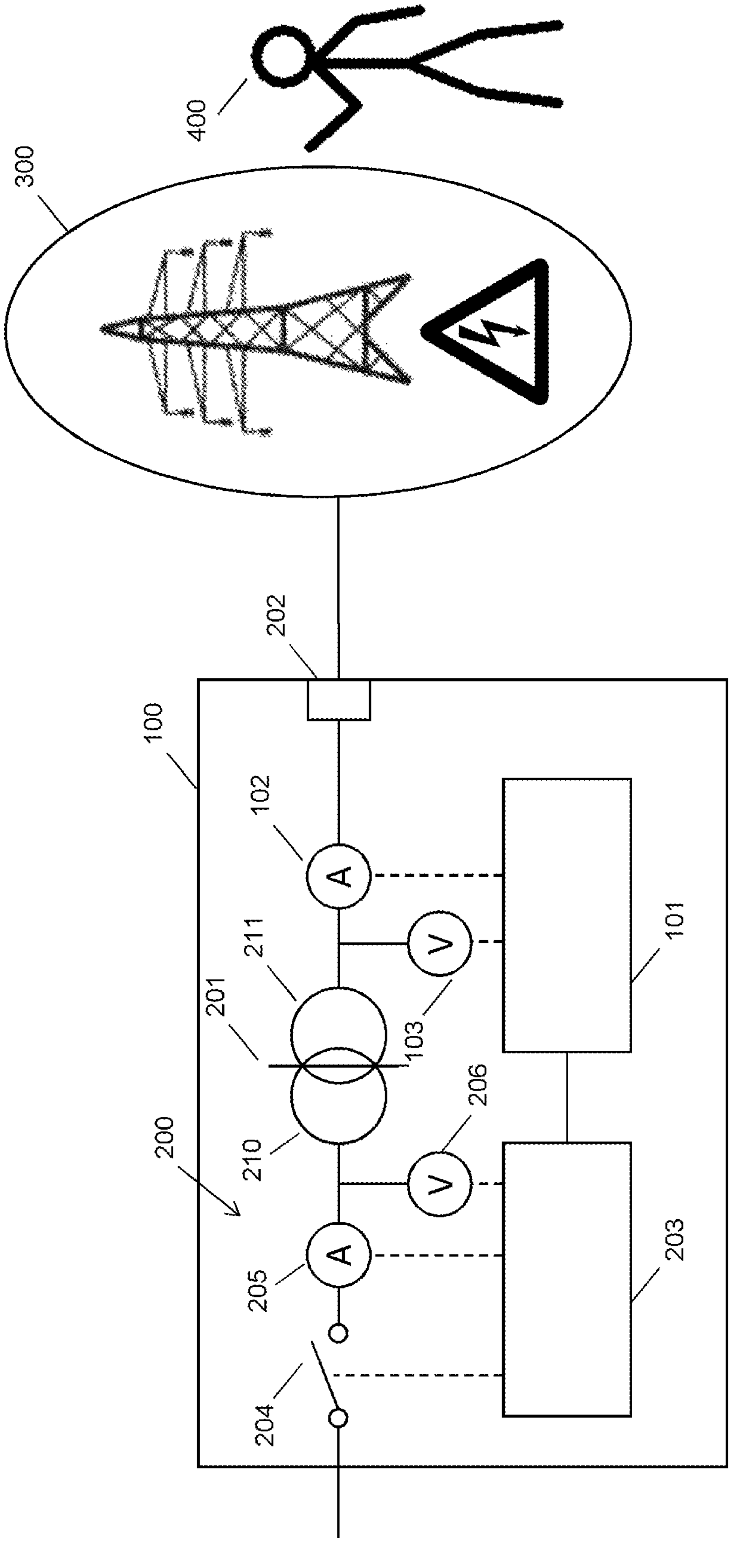
FIG. 1 schematically shows a high-voltage generating device according to an embodiment of the present invention.

FIG. 1 shows a high-voltage AC voltage testing apparatus 100 in connection with a test object or measurement object 300 and a person 400. The test object 300, which is also referred to as test specimen, comprises a high-voltage device, such as for example a transformer, a high-voltage switch or a high-voltage bushing. The high-voltage AC voltage testing apparatus 100 is designed to carry out a high-voltage insulation measurement on the test object 300. To this end, a test voltage in the range of a few 1000 V, for example 2 kV to 12 kV, is applied to the test object 300 and a resultant current through the test object 300 is ascertained. A quality of an insulation of the test object 300 with respect to ground or another conductor can be ascertained using the current and the voltage. To this end, the high-voltage AC voltage testing apparatus 100 has, for example, a current measuring device 102 and a voltage measuring device 103 that measure a current fed into the test object 300 or a voltage present at the test object 300, respectively. In order to gain a high-quality statement regarding the insulation of the test object, the measuring devices 102, 103 have a high level of accuracy and detect electrical signals that are directly connected to the test object 300, for example the current and the voltage. To this end, the current and the voltage can, for example, be sampled, for example with a sampling rate that is considerably above the frequency of the high-voltage AC current fed into the test object 300. In a processing device 101 of the high-voltage AC voltage testing apparatus 100, the sampled current and voltage signals are processed and, for example, an insulation resistance is determined and output to a user.

The high-voltage AC voltage testing apparatus 100 also comprises a high-voltage generating device 200 for generating the high-voltage AC current to be fed into the test object 300. The high-voltage generating device 200 comprises a high-voltage transformer 201 that can be coupled to the test object 300 on an output side 211 with its output winding via an output 202. On an input side 210, an input winding of the high-voltage transformer 201 is connected via a switching device 204 to an energy supply, for example to an energy supply network with a voltage in the range of from 110 to 240 V AC voltage. The high-voltage transformer 201 is designed in such a way that it provides the desired high-voltage AC current at the output winding for the measurement on the basis of the voltage supplied to said high-voltage transformer at the input winding. The high-voltage generating device 200 further comprises a control device 203 and measuring devices 205, 206, for example a current measuring device 205 and a voltage measuring device 206. Compared to the measuring devices 102 and 103, the measuring devices 205, 206 are designed less for high precision, and rather for quick measurement. Just like the measuring devices 102, 103, the measuring devices 205, 206 can sample current values and voltage values, and provide the sample values to the control device 203. A sampling rate of the measuring devices 102, 103 can be considerably higher than the frequency of the voltage on the input winding of the high-voltage transformer 201, for example higher by a factor of 10 to 100, that is to say, for example, a sampling rate of 500 to 5000 sample values per second at a frequency of 50 Hz of the voltage on the input winding. The control device 203 is coupled to the switching device 204 and is capable of switching on and switching off the power supply for the high-voltage transformer 201. The high-voltage generating device 200 can comprise further components in order for example to provide a high-voltage AC current with an adjustable voltage under the control of the control device 203, for example to be able to increase the high-voltage AC current continuously or in stages from for example 1 kV up to 12 kV.

Figure 2:
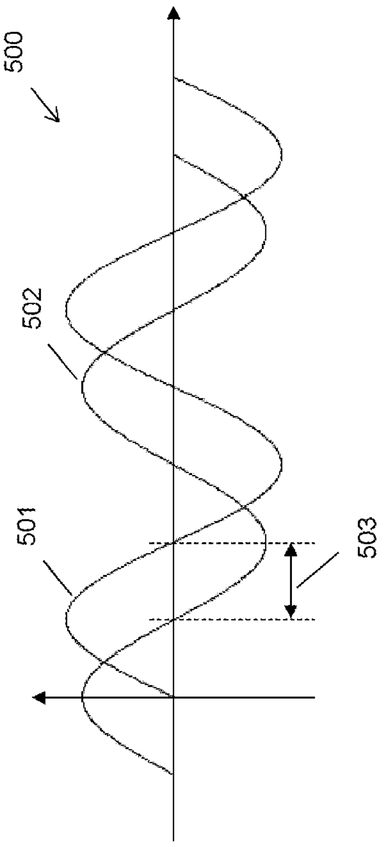
FIG. 2 schematically shows a temporal profile of two electrical variables on a high-voltage transformer of a high-voltage generating device according to an embodiment of the present invention.

FIG. 2 shows a graph 500 with a temporal profile of a voltage 501 and a temporal profile of a current 502, as they arise, for example, on the high-voltage transformer 201 during an insulation measurement of the test object 300 with an essentially capacitive load. In the case of an essentially capacitive load, there is a phase angle 503 of approximately 90° between the temporal profile of the voltage 501 and the lagging temporal profile of the current 502. In a typical insulation measurement of a high-voltage apparatus, such as, for example, a high-voltage transformer or a high-voltage bushing, there is, for example, a capacitance in the range of up to 50 nanofarads, such that, at 12 kV, a maximum current of approximately 150 mA is flowing. This corresponds to an impedance of approximately 60 kΩ to 70 kΩ A loss factor is typically lower than 10%, that is to say the loss angle is smaller than 6° and therefore the phase angle between the current and the voltage is larger than 84°. Loss factor, loss angle and phase angle are directly related to one another. The loss factor is the tangent of the loss angle and the loss angle, in the case of a capacitive load, is 90° minus the phase angle. The following text will essentially take the loss factor into consideration. It is clear, however, that the same considerations apply to the phase angle and the loss angle.

Figure 3:
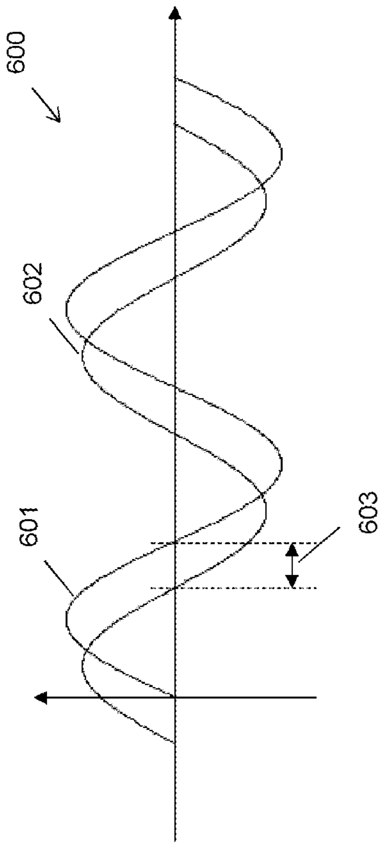
FIG. 3 schematically shows a further temporal profile of two electrical variables on a high-voltage transformer of a high-voltage generating device according to an embodiment of the present invention.

If the person 400 comes into contact with a live part of the test object 300, an additional current can flow through the person 400. Since the human body has a substantially ohmic resistance, the phase angle, loss angle and loss factor change. The impedance of the human body is, among other things, dependent on the applied voltage, the contact area and the position of the contact points at which the voltage is present. The impedance drops as the voltage increases and, in the case of voltages of for example 1000 V, it can have an absolute value in the range of from 700Ω to 1500Ω. FIG. 3 shows a graph 600 with a temporal profile of a voltage 601 and a temporal profile of a current 602, as they arise, for example, on the high-voltage transformer 201 during an insulation measurement of the test object 300 and simultaneous contact with the person 400. A phase angle 603 between the temporal profile of the voltage 601 and the lagging temporal profile of the current 602 is smaller than the phase angle 503 in FIG. 2 without the contact with the person 400. The loss factor increases as a result and is typically at least 10%.

Additionally (but not shown in FIG. 3), the absolute value of the current 602 can increase due to the impedance that is lower overall. As a result, all of the power that is output by the high-voltage transformer 201 at the output winding and therefore taken up at the input winding can also increase. Furthermore, since the high-voltage transformer 201 itself has a particular internal resistance, the voltage 601 can drop due to the lower impedance.

The above-mentioned knowledge can be used to improve personal protection during high-voltage tests or high-voltage measurements, in particular high-voltage insulation measurements. In high-voltage tests, in particular high-voltage insulation measurements, a high voltage of a few 1000 V is applied to the test object. The measuring apparatus that generates this high measurement voltage is in general designed such that touching live parts is precluded. On the test object, for example transformers or high-voltage bushings, the voltage can however also be present on exposed parts that can be touched by a person during the measurement. In order to avoid this, safety measures are usually taken to preclude live parts from being touched. By way of example, these safety measures comprise making the measuring area inaccessible or visual and/or acoustic warnings. In spite of these safety measures, accidents can occur if, for example, safety regulations are not adhered to or are bypassed. If a person comes into contact with a high voltage, the exposure time to this high voltage is of critical importance to the degree of injury. It is therefore important to identify that the person is touching a live part as quickly as possible and in this case to disconnect the voltage as quickly as possible.

Evaluating the current and the voltage in terms of absolute value and phase on the high-voltage transformer 201 allows the control device 203 to ascertain whether the whole load is capacitively dominated, for example if the loss factor is smaller than 10%, and the impedance of the load moves in a range that is typical for a test object and is not typical for a body through which current flows, for example at an impedance of >50 kΩ In this case, the measurement is continued. If, however, the loss factor is greater than for example 10%, or the impedance is in a range that can be brought about by a person through which current flows, for example at an impedance of less than 50 kΩ, the measurement is interrupted immediately. To this end, the control device 203 can open the switching device 204, such that the high-voltage transformer 201 does not provide any high-voltage AC current at the output 202. Furthermore, the high-voltage AC current can be disconnected if the power taken up or output by the high-voltage transformer suddenly changes, a current suddenly increases or the voltage suddenly dips. The detection and disconnection should take place within a very short time after current starts flowing through the person, preferably in less than 300 ms, in order to avoid permanent damage. Accordingly, in a preferred embodiment, the invention is designed in such a way that the method, including the detection and disconnection, takes place within 300 ms. A measurement of electrical variables, in particular a temporal profile of these electrical variables, on the output side 211 of the high-voltage transformer 201, that is to say on the high-voltage side of the high-voltage transformer 201, is in many cases not available quickly enough, since these measurements are generally designed for precision and not for speed. Therefore, corresponding variables are preferably measured on the input side 210 of the high-voltage transformer 201, that is to say on the primary side or low-voltage side of the high-voltage transformer 201, and by taking properties of the high-voltage transformer 201 into account, such as internal losses, for example, the corresponding values on the output side 211 of the high-voltage transformer 201 are estimated in order to therefore achieve a much quicker measurement. The disconnection takes place as soon as it is perceived that a body through which current flows is in the circuit. This can be carried out in a fully automated manner and therefore very quickly, with the result that relatively great personal injury can generally be avoided. A measurement that is running correctly, that is to say a measurement where nobody is in contact with live parts, is therefore not affected.

Figure 4:
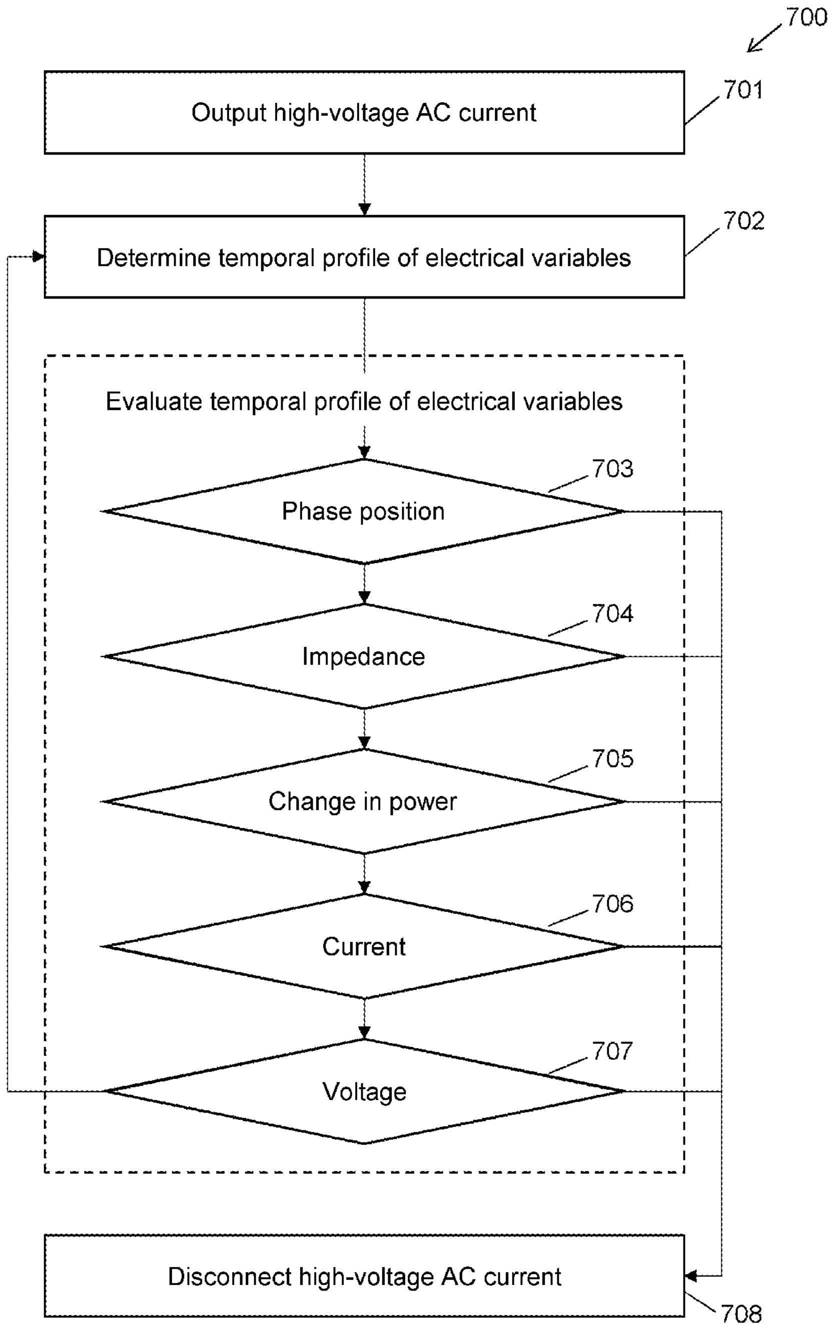
FIG. 4 shows a flow chart with steps of a method according to an embodiment of the present invention.

FIG. 4 shows details of a corresponding method that can be carried out in the control device 203, for example. To this end, the control device 203 can comprise an electronic control means, such as for example a processor, in particular a signal processor. The electronic control means can also be implemented with a similar construction, however. The method 700 shown in FIG. 4 comprises method steps 701 to 708. Although the method steps are shown in a particular order in FIG. 4, the method steps can be executed in any desired other order or in parallel. In particular, the method steps 703 to 707 can be carried out in any desired other order or preferably in parallel in time.

At the start of the high-voltage test, in step 701 a high-voltage AC current is generated in the high-voltage AC voltage testing apparatus 100 and output. To this end, the switching device 204 is switched on so that the high-voltage transformer 201 is supplied with electrical energy. The high-voltage transformer 201 generates a high-voltage AC current from the electrical energy supplied thereto as the test voltage, which high-voltage AC current is output at the output 202. The test object 300 is connected to the output 202. By way of example, the high-voltage test can be a high-voltage insulation measurement in which an insulation of the test object 300 is checked. To this end, the current and the voltage of the high-voltage AC current are ascertained with the aid of the measuring devices 102 and 103 while the high-voltage AC current is being output to the test object 300. In order to achieve accurate measurement results for the high-voltage insulation measurement, the current measuring device 102 and the voltage measuring device 103 are usually designed for a very accurate, yet not very quick, measurement. In particular, the voltage measuring device 103 has to be designed in such a way that it can measure very high voltages of a few 1000 V. Voltage measurements at such high voltages usually require more time than voltage measurements at lower voltages, for example at voltages below 500 V.

The high-voltage AC voltage testing apparatus 100 also has measuring devices on the input side 210 of the transformer 201, for example the current measuring device 205 and the voltage measuring device 206. The measuring devices 205 and 206 can have a lower accuracy than the measuring devices 102 and 103, but are capable of carrying out the measurements much more quickly. By way of example, the measuring devices 205 and 206 can provide present current and voltage values with a sampling rate in the region of from 500 to 5000 sample values per second and a delay of only a few milliseconds, for example less than 100 ms. The sampling rate is considerably higher than the frequency of the high-voltage AC current, for example by a factor of 10 to 100. As a result, a temporal profile of the electrical variables, for example a temporal profile of the current and the voltage on the input side 210 of the high-voltage transformer 201, can be determined on the basis of the sample values in step 702. Corresponding profiles of electrical variables on the output 202 can be deduced by taking into consideration properties of the high-voltage transformer 201, such as the turns ratio between the input winding and the output winding, internal losses and transmission properties, for example.

There is then an evaluation of the temporal profiles of these electrical variables in steps 703 to 707. In this case, either the temporal profiles of the electrical variables on the input side 210 of the high-voltage transformer 201 can be used directly or the temporal profiles, which are estimated therefrom, of the corresponding electrical variables on the output side 211 of the high-voltage transformer 201 can be used. Threshold values used in steps 703 to 707 have to be adjusted accordingly.

The phase position of the current and the voltage is evaluated in step 703. By way of example, on the basis of the phase position of the current with respect to the voltage, a loss factor can be determined and the high-voltage AC current can be disconnected in step 708 if the loss factor rises above a predefined threshold value, for example above 10%. The control device 203 can accordingly actuate the switching device 204 to disconnect the high-voltage AC current in step 708.

In addition, in step 704 an impedance can be ascertained as it results at the output 202 from the point of view of the high-voltage AC voltage testing apparatus 100. The impedance is determined by the test object 300 and possibly by the person 400. If the impedance falls below a predetermined threshold value, for example drops below 50 kΩ, the control device 203 can disconnect the high-voltage AC current by actuating the switching device 204 in step 708.

Furthermore, in step 705, a power output at the output 202 can be estimated and observed over time. By way of example, the power can be the apparent power or the active power. In the event of a sudden change in power, the control device 203 can disconnect the high-voltage AC current in step 708. By way of example, a sudden change in power can be defined by a relative change in power within a predefined time period. By way of example, if the output power increases by a percentage of more than 10% or 20% within 200 ms, this can be regarded as a sudden change in power. This sudden increase can be caused by the person 400 touching a live part. Alternatively, instead of the power output at the output 202, the power taken up by the high-voltage transformer 201 can also be ascertained and, taking internal losses of the high-voltage transformer 201 into consideration, can optionally be used in the same way as a criterion for disconnecting the high-voltage AC current.

In a comparable manner, in step 706, a current output at the output 202 can be estimated and observed over time. By way of example, the current can be an rms current. In the event of a sudden increase in current, the control device 203 can disconnect the high-voltage AC current in step 708. By way of example, the sudden change in current can be defined by a relative change in current within a predefined time period. For example, if the current increases by more than 10% or 20% within a time period of 100 or 200 ms, this can be regarded as a sudden change in current. The sudden increase in the current can be caused by the person 400 making contact with a live part.

Similarly, in step 707, a voltage present at the output 202 can be estimated and observed over time. By way of example, the voltage can be an rms voltage. In the event of a sudden voltage drop, the control device 203 can disconnect the high-voltage AC current in step 708. The sudden voltage drop can arise by the person 400 touching a live part. As a result of the relatively low impedance of the person 400 compared with the impedance of the insulation of the test object 300, the current can rise so sharply that the high-voltage transformer 201 cannot maintain the output voltage on account of its internal resistance or corresponding protective circuitry of the high-voltage transformer 201. Likewise, the control device 203 can disconnect the high-voltage AC current if a desired output voltage is not reached when the high-voltage AC current is switched on.

If the evaluations of the temporal profiles of the electrical variables in steps 703 to 707 do not lead to the high-voltage AC current being disconnected in step 708, the method 700 is continued with step 702 until the high-voltage AC current measurement has ended. Personal protection during a high-voltage AC current measurement can therefore be improved using the above-described method 700.

It goes without saying that the features of the embodiments and aspects of the invention described above can be combined with one another. In particular, the features can be used not only in the combinations described, but also in other combinations or on their own without departing from the scope of the invention.

What is claimed is:

1. A method for personal protection during a high-voltage test on a test object, comprising:

outputting a high-voltage AC current for the test object by means of a high-voltage generating device that has a high-voltage transformer for generating the high-voltage AC current, determining, via a controller operably coupled to the high voltage generating device, a temporal profile of at least one electrical variable at the high-voltage transformer while the high-voltage AC current is being output, ending, by the controller, the outputting of the high-voltage AC current depending on the temporal profile of the at least one electrical variable.

2. The method as claimed in claim 1, wherein the high-voltage transformer comprises an input side and an output side at which the high-voltage AC current is output for the test object, wherein the temporal profile of the at least one electrical variable is determined by means of detection at the input side of the high-voltage transformer, and wherein the outputting of the high-voltage AC current is also ended depending on at least one property of the high-voltage transformer.

3. The method as claimed in claim 1, wherein the at least one electrical variable comprises a phase position and an absolute value of a current on the high-voltage transformer and a phase position and an absolute value of a voltage on the high-voltage transformer.

4. The method as claimed in claim 3, wherein the method also comprises:

determining a phase angle between the current and the voltage at the high-voltage transformer based on the phase positions of the current and the voltage, wherein the outputting of the high-voltage AC current is ended if the phase angle is smaller than a predefined phase angle threshold value.

5. The method as claimed in claim 3, wherein the method also comprises:

determining a loss factor based on the phase positions of the current and the voltage, wherein the outputting of the high-voltage AC current is ended if the loss factor is greater than a predefined loss factor threshold value.

6. The method as claimed in claim 3, wherein the method also comprises:

determining an impedance based on the absolute values and the phase positions of the current and the voltage, wherein the outputting of the high-voltage AC current is ended if the impedance is lower than a predefined impedance threshold value.

7. The method as claimed in claim 3, wherein the method also comprises:

determining a temporal profile of a power output by the high-voltage transformer based on temporal profiles of the absolute values and the phase positions of the current and the voltage, wherein the outputting of the high-voltage AC current is ended if the power output by the high-voltage transformer changes by more than a predefined power change value within a predefined time period.

8. The method as claimed in claim 7, wherein the predefined time period is in a range of from 0 ms to 300 ms.

9. The method as claimed in claim 1, wherein the at least one electrical variable comprises an absolute value of a current at the high-voltage transformer.

10. The method as claimed in claim 9, wherein the outputting of the high-voltage AC current is ended if the absolute value of the current exceeds a predefined current threshold value.

11. The method as claimed in claim 9, wherein the outputting of the high-voltage AC current is ended if a temporal profile of the absolute value of the current changes by more than a predefined current change value within a predefined time period.

12. The method as claimed in claim 11, wherein the predefined time period is in a range of from 0 ms to 300 ms.

13. The method as claimed in claim 1, wherein the at least one electrical variable comprises an absolute value of a voltage on the high-voltage transformer.

14. The method as claimed in claim 13, wherein the outputting of the high-voltage AC current is ended if the absolute value of the voltage does not reach a predefined minimum voltage during the outputting of the high-voltage AC current for the test object.

15. The method as claimed in claim 13, wherein the outputting of the high-voltage AC current is ended if a temporal profile of the absolute value of the voltage changes by more than a predefined voltage change value within a predefined time period.

16. The method as claimed in claim 15, wherein the predefined time period is in a range of from 0 ms to 300 ms.

17. The method as claimed in claim 1, wherein the method is designed in such a way that a period for carrying out the method including the ending of the outputting of the high-voltage AC current is at most 300 ms.

18. The method as claimed in claim 1, wherein the high-voltage test comprises a high-voltage insulation measurement at the test object.

19. The method as claimed in claim 1, wherein the high-voltage AC current output for the test object has a voltage in a range of 2 kV to 12 kV.

20. The method as claimed in claim 1, wherein the outputting of the high-voltage AC current comprises an outputting of a high-voltage AC current with a voltage absolute value that is increased continuously or in stages.

21. A high-voltage generating device for a high-voltage test of a test object, comprising:

a high-voltage transformer for generating a high-voltage AC current, an output for outputting the high-voltage AC current for the test object, and a control device that is designed to protect a person during the high-voltage test by:

outputting the high-voltage AC current for the test object, determining a temporal profile of at least one electrical variable at the high-voltage transformer while the high-voltage AC current is being output, and ending the outputting of the high-voltage AC current depending on the temporal profile of the at least one electrical variable.

22. The high-voltage generating device as claimed in claim 21, wherein the at least one electrical variable comprises a phase position and an absolute value of a current on the high-voltage transformer and a phase position and an absolute value of a voltage on the high-voltage transformer.

23. The high-voltage generating device as claimed in claim 22, wherein the high-voltage generating device is configured to determine an impedance based on the absolute values and the phase positions of the current and the voltage, and
end the output of the high-voltage AC current if the impedance is lower than a predefined impedance threshold value.

* * * * *